United States Patent
Tashiro et al.

(10) Patent No.: US 10,145,007 B2
(45) Date of Patent: Dec. 4, 2018

(54) DLC FILM FILM-FORMING METHOD

(71) Applicant: Dowa Thermotech Co., Ltd., Tokyo (JP)

(72) Inventors: Hiroki Tashiro, Tokyo (JP); Hiroyuki Matsuoka, Tokyo (JP); Motohiro Watanabe, Tokyo (JP); Wataru Sakakibara, Tokyo (JP); Soichiro Nogami, Tokyo (JP)

(73) Assignee: DOWA THERMOTECH CO., LTD., Tokyo (JP)

( * ) Notice: Subject to any disclaimer, the term of this patent is extended or adjusted under 35 U.S.C. 154(b) by 0 days.

(21) Appl. No.: 15/034,839

(22) PCT Filed: Oct. 31, 2014

(86) PCT No.: PCT/JP2014/079074
§ 371 (c)(1),
(2) Date: May 5, 2016

(87) PCT Pub. No.: WO2015/068655
PCT Pub. Date: May 14, 2015

(65) Prior Publication Data
US 2016/0281219 A1  Sep. 29, 2016

(30) Foreign Application Priority Data

Nov. 6, 2013 (JP) .................................. 2013-230539
Feb. 27, 2014 (JP) .................................. 2014-037364
Sep. 9, 2014 (JP) .................................. 2014-183701

(51) Int. Cl.
*C23C 16/27* (2006.01)
*C23C 14/00* (2006.01)
(Continued)

(52) U.S. Cl.
CPC .............. *C23C 16/27* (2013.01); *C01B 32/05* (2017.08); *C01B 32/25* (2017.08);
(Continued)

(58) Field of Classification Search
CPC ......... C23C 16/00; C23C 28/00; C23C 14/00; C01B 31/00
See application file for complete search history.

(56) References Cited

U.S. PATENT DOCUMENTS 6,002,418 A * 12/1999 Yoneda ................ B41J 2/33515
347/203
2001/0044027 A1  11/2001 Anderson
(Continued)

FOREIGN PATENT DOCUMENTS

JP   H09-111458 A   4/1997
JP   2003-527278 A  9/2003
(Continued)

OTHER PUBLICATIONS

"Diamond-like carbon-based functionally gradient coatings for space tribology" C. Donnet, J. Fontaine, T. Le Mogne, M. Belin, C.Heau, J.P. Terrat, F. Vaux, G. Pont, Surface and Coatings Technology, 120-121, (1999) 548-554.*
(Continued)

*Primary Examiner* — Gordon Baldwin
*Assistant Examiner* — Mohammad Mayy
(74) *Attorney, Agent, or Firm* — Michael Best & Friedrich LLP

(57) ABSTRACT

[Problem] To produce a DLC film excellent in hardness and adhesiveness while preventing a film-forming rate from slowing even when the gas pressure in a chamber is a low pressure without requiring a large-scale facility such as a thermostatic device.
[solution] There is provided a DLC film film-forming method being a film-forming method to film-form a DLC
(Continued)

film on a substrate by a plasma CVD method, the method including: setting a voltage to be applied to a substrate using a DC pulse power supply to a bias voltage; using an acetylene gas or a methane gas as a film-forming gas to be supplied into a chamber; setting the total pressure of the gas in the chamber to not less than 0.5 Pa and not more than 3 Pa when the methane gas is used; setting the total pressure of the gas in the chamber to not less than 0.3 Pa and not more than 3 Pa when the acetylene gas is used; and setting the bias voltage to not less than 0.9 kV and not more than 2.2 kV.

6 Claims, 5 Drawing Sheets

(51) Int. Cl.
| | |
|---|---|
| *C23C 14/06* | (2006.01) |
| *C23C 16/26* | (2006.01) |
| *C23C 16/515* | (2006.01) |
| *C23C 14/14* | (2006.01) |
| *C23C 14/34* | (2006.01) |
| *C23C 28/04* | (2006.01) |
| *C01B 32/05* | (2017.01) |
| *C01B 32/25* | (2017.01) |

(52) U.S. Cl.
CPC ...... *C23C 14/0036* (2013.01); *C23C 14/0635* (2013.01); *C23C 14/14* (2013.01); *C23C 14/34* (2013.01); *C23C 14/345* (2013.01); *C23C 16/26* (2013.01); *C23C 16/515* (2013.01); *C23C 28/046* (2013.01); *C23C 28/048* (2013.01)

(56) References Cited

U.S. PATENT DOCUMENTS

| 2004/0038033 | A1* | 2/2004 | Massler | ............... C23C 16/029 428/408 |
|---|---|---|---|---|
| 2006/0254517 | A1 | 11/2006 | Massler et al. | |
| 2007/0175587 | A1 | 8/2007 | Saito et al. | |
| 2008/0292812 | A1 | 11/2008 | Ramm et al. | |
| 2009/0246409 | A1 | 10/2009 | Saito et al. | |

FOREIGN PATENT DOCUMENTS

| JP | 2004-501793 A | 1/2004 |
|---|---|---|
| JP | 2007-194110 A | 8/2007 |
| JP | 2008-540821 A | 11/2008 |
| JP | 2009-263769 A | 11/2009 |
| JP | 2010-174310 A | 8/2010 |
| JP | 2010-528179 A | 8/2010 |

OTHER PUBLICATIONS

International Search Report issued in Application No. PCT/JP2014/079074, dated Jan. 27, 2015.

N. Savvides and T. J. Bell, "Hardness and elastic modules of diamond and diamond-like carbon films", Thin Solid Films, May 15, 1993, pp. 289-292 (4 pages), vol. 228, Issues 1-2, Elsevier.

* cited by examiner

DLC FILM FILM-FORMING METHOD

CROSS-REFERENCE TO RELATED APPLICATIONS

This application is based upon and claims the benefit of priority of the prior Japanese Patent Application No. 2013-230539, filed on Nov. 6, 2013, the prior Japanese Patent Application No. 2014-037364, filed on Feb. 27, 2014, and the prior Japanese Patent Application No. 2014-183701, filed on Sep. 9, 2014, the entire contents of which are incorporated herein by reference.

TECHNICAL FIELD

The present invention relates to a substrate processing system.

BACKGROUND ART

A DLC (Diamond Like Carbon) film has a structure of diamond and graphite being mixed, a structure of an intermediate between the both, is high in hardness and is excellent in abrasion resistance, solid lubricity; thermal conductivity, and chemical stability, to thus be widely used as a protective film of various parts of a sliding member, a mold, cutting tools, an abrasion-resistant machine part, an abrasive, a magneto-optical part, and the like, for example.

As a film-forming method of the DLC film, two types of a PVD (Physical Vapor Deposition) method and a CVD (Chemical Vapor Deposition) method have been known mainly. When these PVD method and CVD method are compared, from the perspective that a film-forming rate of the CVD method is faster than that of the PVD method and the CVD method enables efficient film-forming on a material having a complicated shape, using the CVD method has become the mainstream.

For example, Patent Document 1 discloses a method for producing a DLC film by a plasma CVD method, in which a voltage to be applied to a substrate is set to a bipolar DC pulse voltage, a gas to be supplied into a chamber is set to a toluene-containing gas, and further the total gas pressure in the chamber is set to not less than 4 Pa and not more than 7 Pa. According to Patent Document 1, an intermediate layer can be formed by a PVD method and a DLC film can be formed by a plasma CVD method.

PRIOR ART DOCUMENT

Patent Document

[Patent Document 1] Japanese Laid-open Patent Publication No. 2010-174310

DISCLOSURE OF THE INVENTION

Problems to be Solved by the Invention

However, in the method for producing the DLC film described in Patent Document 1 above, a thermostatic device is required in order to vaporize the toluene-containing gas, and therefore, an increase in size of an apparatus is concerned. Further, the toluene is designated as a hazardous material with inflammability (hazardous material Class 4 Petroleum No. 1 by the Fire Defense Law), and there is also a problem that an environmental load becomes excessive when exhausting air.

Further, in order to improve hardness and adhesiveness of the DLC film, the gas pressure in the chamber is preferably set to a low pressure, and in Patent Document 1 above, although the total gas pressure in the chamber is set to not less than 4 Pa and not more than 7 Pa and a film-forming rate is fast, there is a risk that a DLC film excellent in hardness and adhesiveness cannot be produced.

In consideration of the above-described circumstances, an object of the present invention is to provide a film-forming method capable of producing a DLC film excellent in hardness and adhesiveness while preventing a film-forming rate from slowing even when the gas pressure in a chamber is a low pressure without requiring a large-scale facility such as a thermostatic device.

Means for Solving the Problems

In order to achieve the above-described object, according to the present invention, there is provided a DLC film film-forming method being a film-forming method to film-form a DLC film on a substrate by a plasma CVD method, the method including: setting a voltage to be applied to a substrate using a DC pulse power supply to a bias voltage; using an acetylene gas or a methane gas as a film-forming gas to be supplied into a chamber; setting the total pressure of the gas in the chamber to not less than 0.5 Pa and not more than 3 Pa when the methane gas is used; setting the total pressure of the gas in the chamber to not less than 0.3 Pa and not more than 3 Pa when the acetylene gas is used; and setting the bias voltage to not less than 0.9 kV and not more than 2.2 kV.

An Ar gas may also be mixed with the acetylene gas or the methane gas as the film-forming gas.

A frequency of the pulse power supply may also be set to not less than 1 kHz and not more than 100 kHz.

An intermediate layer may also be formed on the substrate in the chamber by a PVD method, and next a DLC film may also be film-formed in the same chamber by a plasma CVD method.

In the forming of the intermediate layer, an Ar gas and a methane gas may also be used as a film-forming gas, and while changing a sputtering output and a ratio between the Ar gas and the methane gas in the film-forming gas, a composition may also be changed continuously in the intermediate layer.

In the forming of the intermediate layer, the ratio between the Ar gas and the methane gas may also be constituted so that the composition of the intermediate layer becomes rich in metal on the substrate side and becomes rich in carbon on the DLC film side.

Effect of the Invention

According to the present invention, there is provided a film-forming method capable of producing a DLC film excellent in hardness and adhesiveness while preventing a film-forming rate from slowing even when the gas pressure in a chamber is a low pressure without requiring a large-scale facility such as a thermostatic device.

EXPLANATION OF CODES

Figure 1:
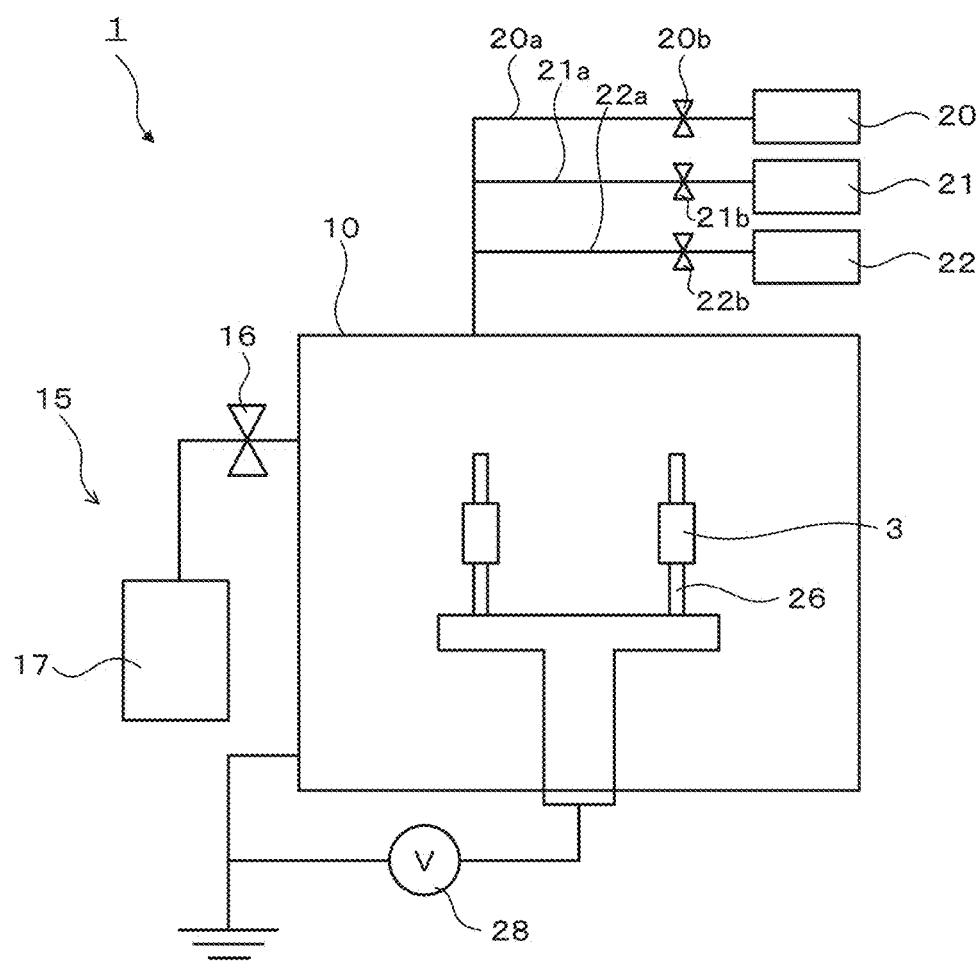
FIG. 1 is a schematic explanatory diagram of a film-forming apparatus 1 according to an embodiment of the present invention.

1 . . . film-forming apparatus
3 . . . substrate
10 . . . chamber
15 . . . exhaust device
20 . . . Ar gas supply unit
21 . . . methane gas supply unit
22 . . . acetylene gas supply unit
28 . . . power supply

MODE FOR CARRYING OUT THE INVENTION

Hereinafter, there will be explained an embodiment of the present invention with reference to the drawings. Incidentally, in this description and the drawings, the same reference numerals and symbols are added to components having substantially the same functional constitutions, and thereby redundant explanations are omitted.

FIG. 1 is a schematic explanatory diagram of a film-forming apparatus 1 according to the embodiment of the present invention. Incidentally, the film-forming apparatus 1 used in the present invention is a general film-forming apparatus that has been known conventionally, so that explanations of detailed constitutions and the like of individual units of the apparatus are sometimes omitted in this description. Incidentally, the film-forming apparatus 1 is an apparatus capable of performing processing by a PVD method and processing by a plasma CVD method both in the same chamber.

As illustrated in FIG. 1, the film-forming apparatus 1 includes a processing chamber (to be also referred to as a chamber simply, hereinafter) 10 in which a substrate 3 is processed, and the chamber 10 is provided with an exhaust device 15 to exhaust internal air. Incidentally, the exhaust device 15 is constituted by a valve 16 and a vacuum pump 17. Further, above the chamber 10, an Ar gas supply unit 20, a methane gas supply unit 21, and an acetylene gas supply unit 22 are provided and are designed to be able to supply individual gasses into the chamber 10 through individual supply channels (20a, 21a, and 22a) separately. Further, openable/closable valves (20, 21b, and 22b) are installed in the individual supply channels.

Further, a support member 26 is provided in the chamber 10, and the substrate 3 to be processed is supported by the support member 26. Outside the chamber 10, a power supply 28 for applying a voltage to the substrate 3 via the support member 26 is provided. This power supply 28 is a DC pulse power supply, and by turning on this power supply 28, a monopolar DC pulse voltage is applied to the substrate 3 as a bias voltage and the gas in the chamber is plasmatized, and thereby a plasma CVD process is performed.

Next, there will be explained film-forming processing to be performed in the film-forming apparatus 1 illustrated in FIG. 1. First, as the substrate 3, for example, an iron-based material such as SCM415, SUS310, or SKD11 is introduced into the chamber 10 to be supported at a predetermined position. In Examples 1 to 13 and Comparative examples 1 to 5 to be described later, a SCM415 having 22.5 min in diameter and 7 mm in height was used. Then, the exhaust device 15 is activated to exhaust air so that the inside of the chamber 10 becomes $2.6\times10^{-3}$ Pa or less, for example, the substrate 3 is heated, and then cleaning of the substrate 3 is performed using Ar ions.

The cleaning of the substrate 3 is performed by steps described in 1) to 8) below, for example.

1) The pressure in the chamber 10 reaches $2.6\times10^{-3}$ Pa, and then the substrate 3 is heated up to 200° C. by a heater (not illustrated).
2) The heater is turned off, and waiting is made for about five minutes or so.
3) An Ar gas is introduced into the chamber 10, a 300-V bias voltage is applied to the substrate, and cleaning of the substrate 3 is performed for about one minute at a gas pressure of 1.3 Pa.
4) The bias voltage application halts for about one minute or so in order to prevent the temperature of the substrate 3 from increasing too much.
5) The above-described steps of 3) and 4) are performed five times repeatedly.
6) An Ar gas is introduced into the chamber 10, a 400-V bias voltage is applied to the substrate, and cleaning of the substrate 3 is performed for one minute at a gas pressure of 1.3 Pa.
7) The bias voltage application halts for about one minute or so in order to prevent the temperature of the substrate 3 from increasing too much.
8) The above-described steps of 6) and 7) are performed 10 times repeatedly.

Subsequently, as a base layer for securing adhesiveness between the substrate 3 and a DLC film, film-forming of an intermediate layer to be formed between the substrate 3 and a DLC film is performed. As this intermediate layer, for example, a Cr+WC (chromium+tungsten carbide) graded layer, a TiC (titanium carbide) graded layer, and the like are cited. The film-forming of this intermediate layer is performed by a generally-known PVD (Physical Vapor Deposition) method using an Ar gas and a methane gas. Here, in film-forming of the Cr+WC graded layer, a Cr target, a WC target, and a C target are used, and in film-forming of the TiC graded layer, a Ti target is used.

As one example of a structure of the intermediate layer, a three-layer structure of a Ti layer→a Ti—TiC graded layer→a TiC layer, for example, is cited, and by such a structure, the adhesiveness is further secured. The intermediate layer having such a three-layer structure is film-formed by steps described in 1) to 3) below, for example.

1) An Ar gas is introduced into the chamber 10 and the pressure is set to 0.4 Pa, and then, a 6-kW sputtering output is applied to a Ti target and a 200-V bias voltage is applied to the substrate 3 to perform film-forming for 30 minutes, and thereby a Ti layer having 0.2 μm is film-formed.
2) The bias voltage is set to 50 V and a methane gas ($CH_4$ gas) is gradually added to the Ar gas, and thereby a Ti—TiC graded layer is formed. The final gas composition is set to Ar gas:methane gas=95:5, the gas pressure is set to 0.4 Pa, the sputtering output is set to 6 kW, and film-forming is performed for 7.5 minutes, and thereby a graded layer having 0.1 μm is film-formed.
3) The gas composition is set to Ar gas:methane gas=90:10, the gas pressure is set to 0.2 Pa, the sputtering output is set to 6 kW, the bias voltage is set to 50 V, and film-forming is performed for 90 minutes, and thereby a TiC layer having 0.3 μm is film-formed.

As described above, as the intermediate layer, the Cr+WC graded layer or the TiC graded layer is film-formed, but a gradient in a film at this time is formed by changing the sputtering output and the ratio between the Ar gas and the methane gas in the film-forming gas in the PVD method. Specifically, there is formed such a continuous composition as, of the intermediate layer, the substrate 3 side (the side close to the substrate 3) is made rich in metal and the DLC film side (the side far from the substrate 3) is made rich in carbon.

Next, film-forming of a DLC film is performed. A film-forming rate during film-forming of the DLC film (a film-forming amount per unit time) can be determined in a manner that the substrate 3 on which the DLC film is film-formed so as to obtain a desired film thickness is cut along a stacked direction and a cut surface is mirror-polished, and then the cut surface is observed by an FE-SEM (field emission scanning electron microscope) to measure the film thickness of the DLC film, and the measured film thickness is divided by a film-forming time.

The film-forming of the DLC film is performed in the film-forming apparatus 1 illustrated in FIG. 1. When a methane gas is used as the film-forming gas, for example, the methane gas is supplied into the chamber 10 from the methane gas supply unit 21 through the supply channel 21a. Here, the bias voltage is applied to the substrate 3 in the chamber 10 by the power supply 28, and the methane gas is plasmatized in the chamber 10. In this manner, the DLC film is film-formed on the substrate 3 by the plasma CVD method.

One example of the film-forming condition of the case when the methane gas is used as the film-forming gas is preferably set that the bias voltage to be applied by the power supply 28 is not less than 0.9 kV and not more than 1.2 kV, of a pulse discharge current, a peak value is 8 A, a frequency is 1 kHz, and a duty ratio is 30%, and the total pressure of the gas in the chamber 10 is not less than 0.5 Pa and not more than 3 Pa. Under such a condition, discharge is stabilized and the film-forming of the DLC film is performed efficiently. Here, when the bias voltage to be applied is less than 0.9 kV, the film-forming rate slows down, and when the bias voltage is greater than 1.2 kV, plasma is not generated stably to cause a risk that the film-forming becomes unstable. Further, when the total pressure of the gas in the chamber 10 is too low, the temperature of the substrate 3 increases too much, and when the total pressure of the gas in the chamber 10 is too high, the hardness of the DLC film decreases, and therefore the total gas pressure is preferably not less than 0.5 Pa and not more than 1.5 Pa, and further preferably not less than 1.0 Pa and not more than 1.5 Pa.

Further, at the time of film-forming of the DLC film, an Ar gas may also be supplied in order to perform adjustment of the total pressure of the gas in the chamber 10. In this case, together with the above-described methane gas supply, an Ar gas is supplied into the chamber 10 from the Ar gas supply unit 20 through the supply channel 20a. At this time, the gas pressure in the chamber 10 is preferably set to not less than 0.5 Pa and not more than 3 Pa in the total pressure mixing the methane gas and the Ar gas. Further, similarly to the above, when the total pressure of the gas in the chamber 10 is too low, the temperature of the substrate 3 increases too much, and when the total pressure of the gas in the chamber 10 is too high, the hardness of the DLC film decreases, and therefore the total gas pressure is preferably not less than 0.5 Pa and not more than 1.5 Pa, and further preferably not less than 1.0 Pa and not more than 1.5 Pa.

Incidentally, the above-explained film-forming conditions will be explained in more detail in Examples to be described later.

As explained above, the film-forming of the intermediate layer and the film-forming of the DLC film are performed under the above-described predetermined conditions in the film-forming apparatus 1 illustrated in FIG. 1. As described above, the film-forming of the intermediate layer and the film-forming of the DLC film are performed in the same film-forming apparatus 1, and the film-forming of the intermediate layer is performed by the PVD method and the film-forming of the DLC film is performed by the plasma CVD method. The DLC film formed as above has a HIT (indentation hardness) of 10 GPa or more and has an adhesiveness of Level 3 or lower. Further, the temperature of the substrate 3 is maintained at about 200° C. or so.

Incidentally, hardness measurement of the DLC film is performed using, for example, a FISCHER SCOPE HM2000 (manufactured by Fischer Instruments) in a manner to find an average value of 20 places, and the adhesiveness of the DLC film is found by a Rockwell indentation test, for example. In the Rockwell indentation test, a load was applied on the surface of a sample under test conditions of a Rockwell C-scale (measurement in conformity with JIS Z 2245: diamond with a pointed end of 0.2 mm in radius of curvature and with a cone angle of 120°, initial test force 98.07 N, and total test force 1471 N) to form an indentation. Further, as the standard of adhesiveness, VDI3198 was used.

It is known that the hardness and the adhesiveness of the DLC film are improved by decreasing the total gas pressure in the chamber 10, and in this embodiment, under a low-gas pressure condition, where the total gas pressure in the chamber 10 is set to not less than 0.5 Pa and not more than 3 Pa, the film-forming is performed. Therefore, it is possible to film-form a DLC film more excellent in hardness and adhesiveness than ever before. Furthermore, under a lower-gas pressure condition, where the total gas pressure is not less than 0.5 Pa and not more than 1.5 Pa and is further not less than 1.0 Pa and not more than 1.5 Pa, the film-forming is performed, resulting in that it is possible to film-form a DLC film excellent in hardness and adhesiveness. Further, under such film-forming conditions, a sufficient film-forming rate can be secured.

Further, in this embodiment, it is constituted that in addition to the film-forming of the DLC film, the film-forming of the intermediate layer formed between the substrate 3 and the DLC film is also performed in the film-forming apparatus 1. That is, it is designed that the film-forming of the DLC film by the plasma CVD method and the film-forming of the intermediate layer by the PVD method are performed in the same film-forming apparatus 1. Further, as the film-forming gas, the methane gas is used, and therefore a thermostatic device or the like to vaporize gas is not required. That is, an auxiliary device and the like are not used and further a plurality of film-forming apparatuses are not required to be used, and therefore, the film-forming of the DLC film can be performed without increasing the size of a facility.

In the foregoing, one example of the embodiment of the present invention has been explained, but the present invention is not limited to the illustrated embodiment. It is apparent that those skilled in the art are able to devise various variation or modification examples within the scope of the technical spirit described in the claims, and it should be understood that such examples belong to the technical scope of the present invention as a matter of course.

For example, in the above-described embodiment, the explanation was made while citing the methane gas, or the methane gas and the Ar gas as the film-forming gas for the DLC film, but in place of the methane gas, an acetylene gas may also be used. Thus, as another embodiment of the present invention, there will be hereinafter explained a film-forming condition of the case when an acetylene gas is used as the film-forming gas. Incidentally, a film-forming apparatus to be used is the film-forming apparatus 1 described in the above-described embodiment (see FIG. 1), and the acetylene gas is supplied into the chamber 10 from the acetylene gas supply unit 22 during film-forming.

One example of the film-forming condition of the case when the acetylene gas is used as the film-forming gas is preferably set that the bias voltage to be applied by the power supply 28 is not less than 1 kV and not more than 2.2 kV, of a pulse discharge current, a peak value is 8 A, a frequency is 1 kHz, and a duty ratio is 30%, and the total pressure of the gas in the chamber 10 is not less than 0.3 Pa and not more than 3 Pa. Under such a condition, discharge is stabilized and film-forming of a DLC film is performed efficiently. Here, when the bias voltage to be applied is less than 1 kV, the film-forming rate slows down, and when the bias voltage is greater than 2.2 kV, plasma is not generated stably to cause a risk that the film-forming becomes unstable. Further, when the total pressure of the gas in the chamber 10 is too low, the temperature of the substrate 3 increases too much, and when the total pressure of the gas in the chamber 10 is too high, the hardness of the DLC film decreases, and therefore the total gas pressure is preferably not less than 0.3 Pa and not more than 1.5 Pa, and further preferably not less than 1.0 Pa and not more than 1.5 Pa. In pulse discharge by the DC pulse power supply, rising of a pulse wave is good even under the circumstances where the total gas pressure is low as above, so that the film-forming of the DLC film can be controlled flexibly. Particularly, the film state can be controlled by fluctuations of a pulse frequency, and the hardness and the like change. Further, by performing the pulse discharge by the DC pulse power supply, a voltage applying time can be controlled easily and a work temperature during the film-forming can be suppressed even when a high-voltage bias voltage is discharged.

Further, at the time of film-forming of the DLC film, an Ar gas may also be supplied in order to perform adjustment of the total pressure of the gas in the chamber 10 similarly to the case of the above-described embodiment. In this case, together with the acetylene gas supply, the Ar gas is supplied into the chamber 10 from the Ar gas supply unit 20 through the supply channel 20a. At this time, the gas pressure in the chamber 10 is preferably set to not less than 0.3 Pa and not more than 3 Pa in the total pressure mixing the acetylene gas and the Ar gas. Further, when the total pressure of the gas in the chamber 10 is too low, the temperature of the substrate 3 increases too much, and when the total pressure of the gas in the chamber 10 is too high, the hardness of the DLC film decreases, and therefore, the total gas pressure is preferably not less than 0.3 Pa and not more than 1.5 Pa, and further preferably not less than 1.0 Pa and not more than 1.5 Pa.

When the acetylene gas is used as the film-forming gas by the film-forming condition according to another embodiment of the present invention, the DLC film has a HIT (indentation hardness) of 10 GPa or more and has an adhesiveness of Level 2 or lower. Further, the temperature of the substrate 3 is maintained at about 200° C. or so.

Further, when in addition to the acetylene gas, an Ar gas is supplied into the chamber 10, it is preferably set that of a pulse discharge current, a peak value is 8 A, a frequency is 1 kHz, and a duty ratio is 30%, and the total pressure of the gas in the chamber 10 is not less than 0.5 Pa and not more than 1.5 Pa. Further, a flow rate ratio of the Ar gas to the acetylene gas at this time is preferably about 20%, for example.

Under such a condition, the Ar gas is supplied into the chamber to perform the film-forming of the DLC film, thereby making it possible to film-form a DLC film having a HIT (indentation hardness) of 15 GPa or more and having an adhesiveness of Level 3 or lower. Further, the temperature of the substrate 3 at this time is maintained at about 250° C. or lower.

Also in the case when the acetylene gas is used as the film-forming gas to film-form the DLC film under the above-explained film-forming conditions, the film-forming is performed under a low-gas pressure condition similarly to the above-described embodiment, and therefore, it is possible to film-form a DLC film more excellent in hardness and adhesiveness than ever before. Further, under a lower-gas pressure condition, where the total gas pressure is not less than 0.3 Pa and not more than 5 Pa and further not less than 1.0 Pa and not more than 1.5 Pa, the film-forming is performed, and thereby it is possible to film-form a DLC film excellent in hardness and adhesiveness. Further, under such a film-forming condition, a sufficient film-forming rate can be secured. Further, an auxiliary device and the like are not used and further a plurality of film-forming apparatuses are not required to be used, and therefore it is possible to perform the film-forming of the DLC film without increasing the size of a facility.

EXAMPLE

Hereinafter, as Examples of the present invention, film-forming of DLC films was performed under various film-forming conditions, the film-forming under the predetermined conditions explained in the above-described embodiments was set as Example, film-forming under conditions deviating from the conditions was set as Comparative example, and film characteristics of the DLC films in the individual cases were measured. Incidentally, both in Examples and Comparative examples, as a film-forming apparatus, an apparatus having the constitution explained in the above-described embodiment with reference to FIG. 1 was used. Further, as a substrate, a SCM415 having 22.5 mm in diameter and having 7 mm in height was used. As a precondition, in the apparatus according to the above-described embodiment, the exhaust device was activated to exhaust air so that the inside in the chamber became $2.6 \times 10^{-3}$ Pa or less, and cleaning of the substrate was performed by the method explained in the above-described embodiment as the cleaning steps 1) to 8). Then, after the substrate was cleaned, an intermediate layer having a three-layer structure of a Ti layer→a Ti—TiC graded layer→a TiC layer was film-formed on the substrate by the method explained in the above-described embodiment as the intermediate layer film-forming steps 1) to 3). Subsequently, on the intermediate layer film-formed on the substrate, film-forming of a DLC film was performed using the plasma CVD method just as each of Examples and Comparative examples to be explained below. Here, as gases used for the cleaning and the film-forming of the intermediate layer, gases used in each of Examples and Comparative examples were used.

(Methane Gas)

Figure 2:
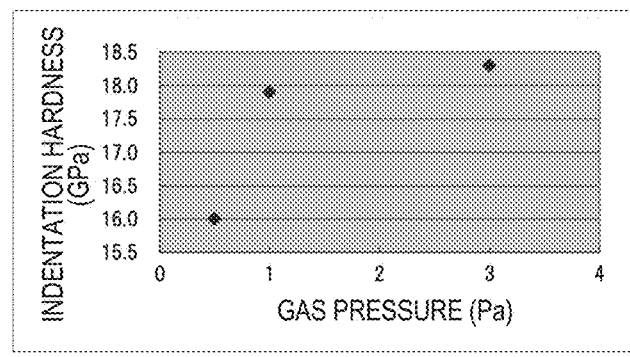
FIG. 2 is a graph illustrating the relationship between a gas pressure and a HIT (indentation hardness) of Examples 1 to 3.

First, as Examples 1 to 3 and Comparative examples 1 and 2, film-forming of DLC films was performed using only a methane gas with a purity of 99.9995% as a film-forming gas. Film-forming conditions (a gas pressure, a gas flow rate, a power supply condition, a film-forming time, a film-forming rate, and a substrate temperature) of Examples 1 to 3 and Comparative examples 1 and 2 are as illustrated in Table 1 below. Further, in Table 1, film characteristics (film thickness, surface hardness, and adhesiveness) of the DLC films film-formed under the individual film-forming conditions are also described. Further, FIG. 2 is a graph illustrating the relationship between the gas pressure and the HIT (indentation hardness) of Examples 1 to 3, FIG. 3 is a graph illustrating the relationship between the gas pressure and the film-forming rate, and FIG. 4 is a graph illustrating the relationship between the gas pressure and the substrate (work) temperature.

conditions. When the adhesiveness is bad, the DLC film peels off easily, so that the DLC film is not suitable for practical use. Therefore, the preferable adhesiveness is in a range of Level 1 to Level 3, and it is more preferably Level 1 and Level 2.

Figure 3:
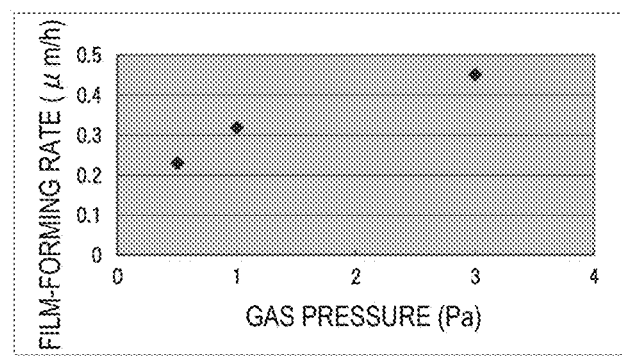
FIG. 3 is a graph illustrating the relationship between the gas pressure and a film-forming rate of Examples 1 to 3.

Further, as illustrated in FIG. 3, in Examples 1 to 3, the film-forming rate is in a range of about 0.2 μm/h to 0.45 μm/h, and therefore the sufficient film-forming rate is secured. When the film-forming rate is slow, productivity deteriorates, and when the film-forming rate is too fast, it becomes difficult to control the film thickness. In the DLC film having a film thickness of 2 μm or less, the film-forming rate of 0.2 μm/h to 5 μm/h or so is preferable, and it is more preferably 1 μm/h to 5 μm/h.

Figure 4:
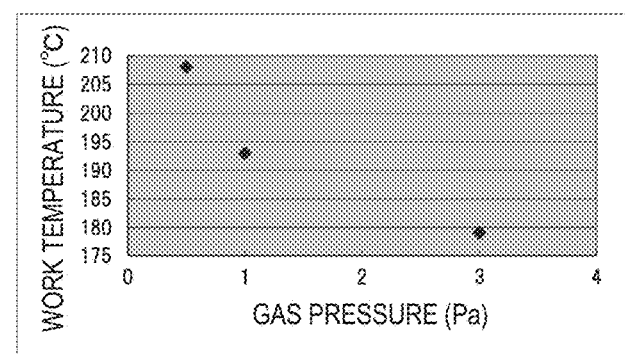
FIG. 4 is a graph illustrating the relationship between the gas pressure and a substrate (work) temperature of Examples 1 to 3.

Further, as illustrated in FIG. 4, in Examples 1 to 3, the substrate (work) temperature is in a range of about 179° C. to 208° C. to thus fall within a preferable range. That is, when the work temperature is too high, there is a risk that a steel product as the substrate softens. Further, more substrates become blunted, and therefore there is a risk that steel products usable as the substrate are limited. Further, when the work temperature is too low, the film-forming gas is decomposed and ion energy of generated hydrocarbon ions decreases, resulting in that the adhesiveness of the DLC film to the substrate and the hardness of the DLC film decrease. Therefore, the preferable substrate (work) temperature is in a range of 100° C. to 250° C., and it is more preferably 150° C. to 220° C.

In the meantime, the gas pressures of Comparative examples 1 and 2 were set to 0.3 Pa and 4 Pa, and film-forming was performed. As a result, under the film-forming conditions of Comparative examples 1 and 2, discharge did not occur stably in the apparatus and the film-forming of the DLC film was not performed. When the gas pressure in the film-forming apparatus is too low, a discharge starting voltage becomes too high, resulting in that discharge cannot be performed. Further, when the gas pres-

TABLE 1

| | | | | COMPARATIVE EXAMPLE 1 | EXAMPLE 1 | EXAMPLE 2 | EXAMPLE 3 | COMPARATIVE EXAMPLE 2 |
|---|---|---|---|---|---|---|---|---|
| DLC FILM-FORMING CONDITION | GAS | | | CH4 | CH4 | CH4 | CH4 | CH4 |
| | PRESSURE | | Pa | 0.3 | 0.5 | 1 | 3 | 4 |
| | GAS FLOW RATE | | sccm | 700 | 700 | 700 | 700 | 700 |
| PLASMA CVD | POWER SUPPLY | MODE | | PULSE | PULSE | PULSE | PULSE | PULSE |
| | | FREQUENCY | Hz | 1K | 1K | 1K | 1K | 1K |
| | | Duty RATIO | % | 30 | 30 | 30 | 30 | 30 |
| | | BIAS VOLTAGE | kV | NO | 1.2 | 0.9 | 0.9 | NO |
| | | DISCHARGE CURRENT | A | DISCHARGE | 8 | 8 | 8 | DISCHARGE |
| | DLC FILM-FORMING TIME | | min | | 420 | 240 | 240 | |
| | DLC FILM-FORMING RATE | | μm/h | | 0.23 | 0.32 | 0.45 | |
| | SUBSTRATE TEMPERATURE | | ° C. | | 208 | 193 | 179 | |
| FILM CHARACTERISTICS | FILM THICKNESS | TOTAL THICKNESS | μm | | 2.24 | 1.87 | 2.38 | |
| | | DLC | μm | | 1.64 | 1.27 | 1.78 | |
| | | TiC | μm | | 0.6 | 0.6 | 0.6 | |
| | SURFACE HARDNESS | HIT | GPa | | 16.0 | 17.9 | 18.3 | |
| | ADHESIVENESS | ROCKWELL INDENTATION | | | LEVEL 1 | LEVEL 1 | LEVEL 3 | |

As illustrated in Table 1, the gas pressures of Examples 1 to 3 were set to 0.5 Pa, 1 Pa, and 3 Pa respectively. Further, the gas pressures of Comparative examples 1 and 2 were set to 0.3 Pa and 4 Pa respectively. As illustrated in Table 1 and FIG. 2, as for the film-forming conditions illustrated in Examples 1 to 3, it was possible to film-form such a DLC film as the surface hardness (MT) is 10 GPa or more and the adhesiveness is Level 3 or lower even under each of the sure in the film-forming apparatus is too high, arc discharge starts, resulting in that the film-forming cannot be performed.

As explained above, it was found that under the film-forming conditions of Examples 1 to 3 illustrated in Table 1 and FIGS. 2 to 4, the methane gas is used as the film-forming gas and the DLC film excellent in surface hardness and adhesiveness can be obtained. Further, it was found that the substrate temperature and the film-forming rate on this occasion each also fall within a preferable numerical value range.

(Acetylene Gas)

Figure 5:
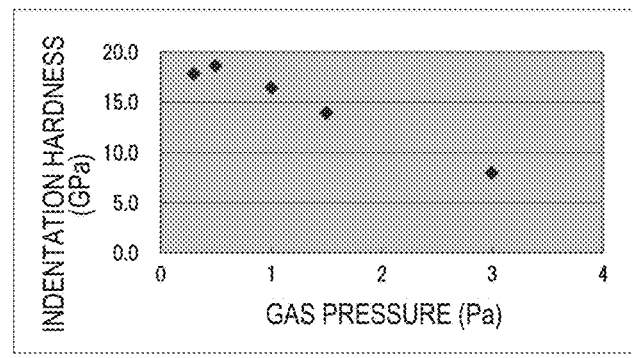
FIG. 5 is a graph illustrating the relationship between a gas pressure and a HIT (indentation hardness) of Examples 4 to 8.
Figure 6:
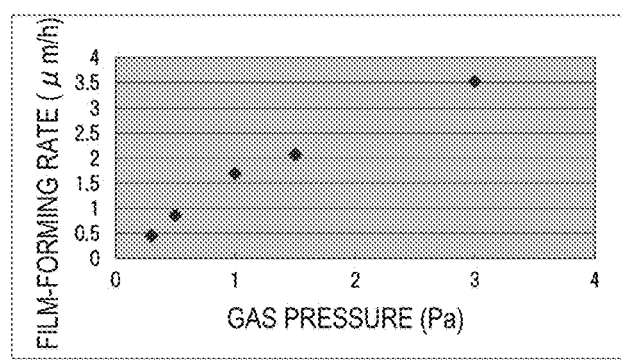
FIG. 6 is a graph illustrating the relationship between the gas pressure and a film-forming rate of Examples 4 to 8.
Figure 7:
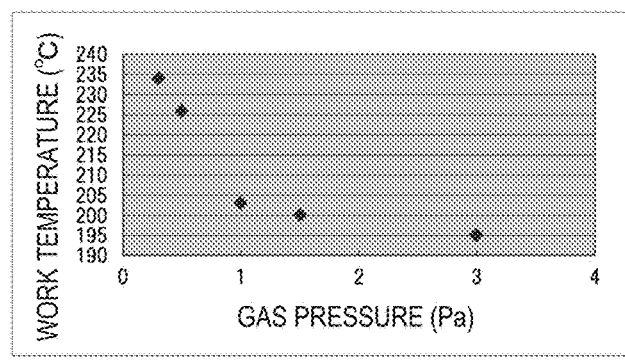
FIG. 7 is a graph illustrating the relationship between the gas pressure and a substrate (work) temperature of Examples 4 to 8.

Next, as Examples 4 to 8 and Comparative examples 3 and 4, film-forming of DLC films was performed using only an acetylene gas with a purity of 98% as a film-forming gas. Film-forming conditions of Examples 4 to 8 and Comparative examples 3 and 4 are as illustrated in Table 2 below. Further, in Table 2, film characteristics of the DLC films film-formed under the individual film-forming conditions are also described. Further, FIG. 5 is a graph illustrating the relationship between the gas pressure and the HIT (indentation hardness) of Examples 4 to 8, FIG. 6 is a graph illustrating the relationship between the gas pressure and the film-forming rate, and FIG. 7 is a graph illustrating the relationship between the gas pressure and the substrate (work) temperature.

experiment, ones without the measurement being performed thereon exist under some of the film-forming conditions.

Further, in the ball-on-disk test, a testing apparatus "Ball on Disk type friction and wear tester tribometer TRB-S-BU-0000 (manufactured by CSM Instruments)" was used and samples fabricated under the same conditions as those of individual examples with the same film thickness and the same substrate size were used and the test was performed. Incidentally, the test was performed under the condition of room temperature of 18.60° C. and humidity of 22%, and the ball-on-disk test condition was set as follows: sliding speed: 2 cm/s, load: 5N, sliding radius: 4 mm, sliding distance: 100 m, atmosphere: dry, and ball: SUJ2/φ6.

As illustrated in Table 2, the gas pressures of Examples 4 to 8 were set to 0.3 Pa, 0.5 Pa, 1 Pa, 1.5 Pa, and 3 Pa respectively. Further, the gas pressures of Comparative examples 3 and 4 were set to 0.1 Pa and 4 Pa respectively. As illustrated in Table 2 and FIG. 5, under the film-forming

TABLE 2

| | | | | COMPARATIVE EXAMPLE 3 | EXAMPLE 4 | EXAMPLE 5 | EXAMPLE 6 | EXAMPLE 7 | EXAMPLE 8 | COMPARATIVE EXAMPLE 4 |
|---|---|---|---|---|---|---|---|---|---|---|
| DLC FILM-FORMING CONDITION | GAS | | | C2H2 | C2H2 | C2H2 | C2H2 | C2H2 | C2H2 | C2H2 |
| | PRESSURE | | Pa | 0.1 | 0.3 | 0.5 | 1 | 1.5 | 3 | 4 |
| | GAS FLOW RATE | | sccm | 1000 | 1000 | 1000 | 1000 | 1000 | 1000 | 1000 |
| PLASMA CVD | POWER SUPPLY | MODE | | PULSE | PULSE | PULSE | PULSE | PULSE | PULSE | PULSE |
| | | FREQUENCY | Hz | 1K | 1K | 1K | 1K | 1K | 1K | 1K |
| | | Duty RATIO | % | 30 | 30 | 30 | 30 | 30 | 30 | 30 |
| | | BIAS VOLTAGE | kV | NO DISCHARGE | 2.2 | 1.8 | 1.2 | 1.1 | 1 | NO DISCHARGE |
| | | DISCHARGE CURRENT | A | | 8 | 8 | 8 | 8 | 8 | |
| | DLC FILM-FORMING TIME | | min | | 173 | 75 | 75 | 75 | 30.3 | |
| | DLC FILM-FORMING RATE | | μm/h | | 0.46 | 0.86 | 1.7 | 2.07 | 3.52 | |
| | SUBSTRATE TEMPERATURE | | ° C. | | 234 | 226 | 203 | 200 | 195 | |
| FILM CHARACTERISTICS | FILM THICKNESS | TOTAL THICKNESS | μm | | 1.92 | 1.67 | 2.72 | 3.19 | 2.38 | |
| | | DLC | μm | | 1.32 | 1.07 | 2.12 | 2.59 | 1.78 | |
| | | TiC | μm | | 0.6 | 0.6 | 0.6 | 0.6 | 0.6 | |
| | SURFACE HARDNESS | HIT | GPa | | 17.8 | 18.6 | 16.4 | 13.9 | 8.0 | |
| | ADHESIVENESS | ROCKWELL INDENTATION | | | LEVEL 1 | LEVEL 1 | LEVEL 1 | LEVEL 2 | LEVEL 1 | |
| | FRICTION COEFFICIENT | BALL-ON-DISK | | | MEASUREMENT | 0.23 | 0.17 | 0.15 | 0.27 | |
| HEAT RESISTANCE (300° C. HEATING) | SURFACE HARDNESS | HIT | GPa | | NOT PERFORMED | 23.7 | 18.2 | MEASUREMENT | 9.8 | |
| HEAT RESISTANCE (400° C. HEATING) | SURFACE HARDNESS | HIT | GPa | | | 20.5 | 17.7 | NOT PERFORMED | 1.4 | |
| HEAT RESISTANCE (450° C. HEATING) | SURFACE HARDNESS | HIT | GPa | | | 19.1 | 18.9 | | FILM DISAPPEARED | |

Further, as illustrated in Table 2, as characteristic tests of the DLC films film-formed under the film-forming conditions of Examples 4 to 8, measurement of a friction coefficient by a ball-on-disk test was performed, and further a heat resistance test was performed. In the heat resistance test, samples fabricated under the same conditions as those of individual examples with the same film thickness and the same substrate size were used and measurement was performed. Then, evaluation of heat resistance was performed in accordance with the change of surface hardness made when the temperature of the DLC film was increased up to each temperature. Incidentally, for convenience of the conditions illustrated in Examples 4 to 8, it was possible to film-form such a DLC film as the surface hardness (MT) is 8 GPa or more and the adhesiveness is Level 2 or less. That is, such a DLC film as the adhesiveness falls within the above-described preferable range was film-formed.

Further, as illustrated in FIG. 6, in Examples 4 to 8, the film-forming rate was in a range of about 0.5 μm/h to 3.5 μm/h, and such film-forming as the film-forming rate falls within the above-described preferable range was performed.

Further, as illustrated in FIG. 7, in Examples 4 to 8, the substrate (work) temperature was in a range of about 195° C.

to 234° C., and the film-forming was performed so that the substrate (work) temperature fell within the above-described preferable range.

Further, in Examples 5, 6, 7 and 8, friction coefficients of the DLC films film-formed under the individual film-forming conditions were 0.27 to 0.15, and the DLC films each having a low friction coefficient were film-formed. When the friction coefficient is high, energy loss increases when the DLC film is applied as a sliding part, and therefore the lower friction coefficient is preferable. For example, the preferable range of the friction coefficient is 0.3 or less, and it is more preferably 0.2 or less.

Further, as for the heat resistance of the DLC films film-formed under the individual film-forming conditions, the films were heated up to 300° C., 400° C., and 450° C. after the film-forming, and it was found in Examples 5 and 6 that a rate of change of the HIT is also small up to 450° C. and film softening is also not seen. Further, it was found in Example 8 that a rate of change of the HIT is also small up to 300° C. and film softening is also not seen. When the heat resistance of the DLC film is lower than 300° C., application to an environment where the temperature rises high becomes impossible, and therefore the higher heat resistance is preferable. For example, the preferable range of the heat resistance is 300° C. or higher, and it is more preferably 400° C. or higher. It is still more preferably 450° C. or higher.

In the meantime, the gas pressures of Comparative examples 3 and 4 were set to 0.1 Pa and 4 Pa respectively and film-forming was performed. As a result, under the film-forming conditions of Comparative examples 3 and 4, discharge did not occur stably in the apparatus and film-forming of the DLC film was not performed. Incidentally, the reason why discharge does not occur stably when the gas pressure is too low or too high is the same as that of the above-described methane gas case.

Figure 8:
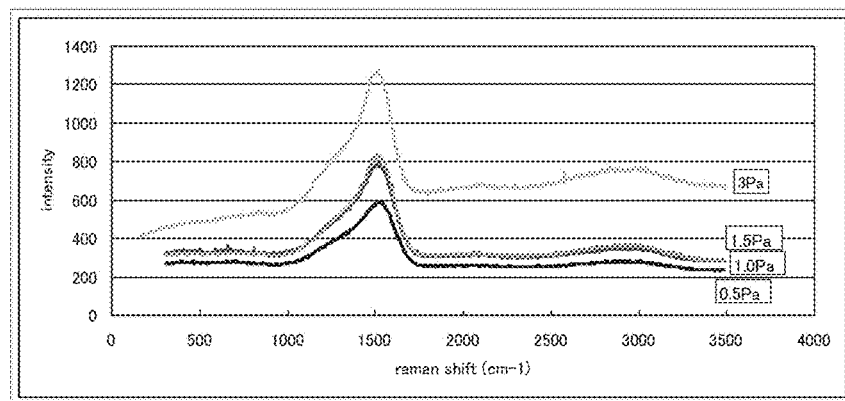
FIG. 8 is a graph illustrating results of a Raman analysis.

Further, as for the DLC films film-formed under the film-forming conditions of Examples 5 to 8, measurement of an in-film hydrogen content was performed by an ERDA method (Elastic Recoil Detection Analysis) and a Raman analysis (laser Raman spectroscopic analysis). The Raman analysis was performed using a Raman spectroscopic analyzer "NRS-5100 (manufactured by JASCO Corporation)," and analysis conditions were set as follows: laser wavelength: 532 nm, measuring range: 150 to 3500 $cm^{-1}$, exposure time: 30 sec, and cumulative number of times: two times. FIG. 8 is a graph illustrating results of the Raman analysis of the individual films found when the film-forming pressure was changed. As illustrated in FIG. 8, it is found that a background intensity (Intensity) increases more with an increase in the film-forming pressure. The DLC film is known that when the in-film hydrogen content increases, the background intensity in the Raman analysis increases, and therefore it is conceived that the in-film hydrogen content increases with an increase in the film-forming pressure.

Further, as a result of the measurements, the hydrogen content in the DLC film of individual Examples 5 to 8 was as follows: Example 5: 16.1 at %, Example 6: 20.0 at %, Example 7: 21.4 at %, and Example 8: 22.8 at %. The in-film hydrogen content closely relates to the characteristics of the DLC film, and it is known that when the in-film hydrogen content decreases, the hardness of the film increases. Considering this point, the preferable range of the in-film hydrogen content for making the hardness of the film fall within a predetermined range is 5 at % or more to less than 50 at %, and it is more preferably 5 at % or more to less than 25 at %. It is still more preferably 5 at % or more to less than 21 at %. What is necessary to make the in-film hydrogen content fall within a preferable range as above is to adjust the film-forming pressure appropriately.

As explained above, it was found that under the film-forming conditions of Examples 4 to 8 illustrated in Table 2 and FIG. 5 to FIG. 7, the acetylene gas is used as the film-forming gas and the DLC film excellent in surface hardness and adhesiveness can be obtained. Further, it was found that the substrate temperature and the film-forming rate on this occasion each also fall within a preferable numerical value range.

(Acetylene Gas Ar Gas)

Figure 9:
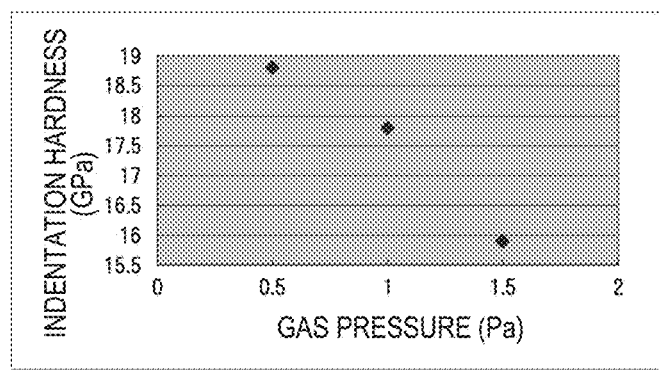
FIG. 9 is a graph illustrating the relationship between a gas pressure and a HIT (indentation hardness) of Examples 9 to 11.
Figure 10:
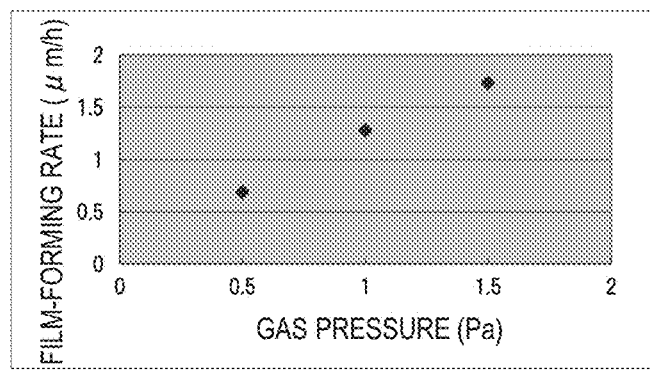
FIG. 10 is a graph illustrating the relationship between the gas pressure and a film-forming rate of Examples 9 to 11.
Figure 11:
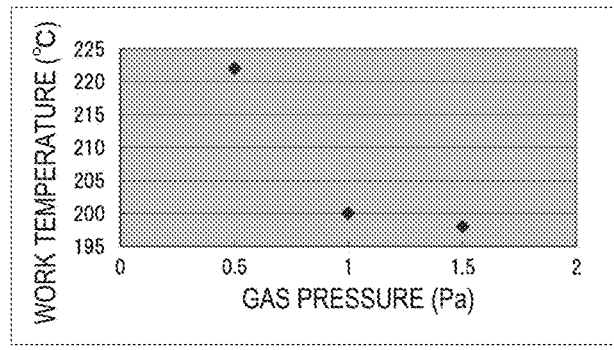
FIG. 11 is a graph illustrating the relationship between the gas pressure and a substrate (work) temperature of Examples 9 to 11.

Next, as Examples 9 to 11 and Comparative example 5, a film-forming gas obtained by adding 20% in a flow rate ratio of Ar gas with a purity of 99.9999% to an acetylene gas with a purity of 98% was used and film-forming of DLC films was performed. Film-forming conditions of Examples 9 to 11 and Comparative example 5 are as illustrated in Table 3 below. Further, in Table 3, film characteristics of the DLC films film-formed under the individual film-forming conditions are also described. Further, FIG. 9 is a graph illustrating the relationship between the gas pressure and the HIT (indentation hardness) of Examples 9 to 11, FIG. 10 is a graph illustrating the relationship between the gas pressure and the film-forming rate, and FIG. 11 is a graph illustrating the relationship between the gas pressure and the substrate (work) temperature.

TABLE 3

| | | | | EXAMPLE 9 | EXAMPLE 10 | EXAMPLE 11 | COMPARATIVE EXAMPLE 5 |
|---|---|---|---|---|---|---|---|
| DLC FILM-FORMING CONDITION PLASMA CVD | GAS | | | $C_2H_2$ + 20% Ar | $C_2H_2$ + 20% Ar | $C_2H_2$ + 20% Ar | $C_2H_2$ + 20% Ar |
| | PRESSURE | | Pa | 0.5 | 1 | 1.5 | 1 |
| | GAS FLOW RATE | | sccm | 1000 | 1000 | 1000 | 1000 |
| | POWER SUPPLY | MODE | | PULSE | PULSE | PULSE | PULSE |
| | | FREQUENCY | Hz | 1K | 1K | 1K | 1K |
| | | Duty RATIO | % | 30 | 30 | 30 | 30 |
| | | BIAS VOLTAGE | kV | 1.5 | 1.2 | 1.2 | 0.6 |
| | | DISCHARGE CURRENT | A | 8 | 8 | 8 | 8 |
| | DLC FILM-FORMING TIME | | min | 186 | 96 | 78 | 96 |
| | DLC FILM-FORMING RATE | | µm/h | 0.69 | 1.28 | 1.73 | 0.74 |
| | SUBSTRATE TEMPERATURE | | ° C. | 222 | 200 | 198 | 130 |
| FILM CHARACTERISTICS | FILM THICKNESS | TOTAL THICKNESS | µm | 2.73 | 2.64 | 2.84 | 1.78 |
| | | DLC | µm | 2.13 | 2.04 | 2.25 | 1.18 |
| | | TiC | µm | 0.6 | 0.6 | 0.6 | 0.6 |
| | SURFACE HARDNESS | HIT | GPa | 18.8 | 17.8 | 15.9 | 10.5 |

TABLE 3-continued

|  |  | EXAMPLE 9 | EXAMPLE 10 | EXAMPLE 11 | COMPARATIVE EXAMPLE 5 |
|---|---|---|---|---|---|
| ADHESIVENESS | ROCKWELL INDENTATION | LEVEL 1 | LEVEL 1 | LEVEL 3 | LEVEL 4 |

As illustrated in Table 3, the gas pressures of Examples 9 to 11 were set to 0.5 Pa, 1 Pa, and 1.5 Pa respectively. Further, in Comparative example 5, the gas pressure was set to 1 Pa and the bias voltage of the power supply was set to 0.6 kV. Incidentally, these gas pressures each mean the total pressure of the film-forming gas obtained by adding 20% in a flow rate ratio of Ar gas to an acetylene gas. As illustrated in Table 3 and FIG. 9, under the film-forming conditions illustrated in Examples 9 to 11, it was possible to film-form such a DLC film as the surface hardness (HIT) is about 16 GPa or more and the adhesiveness is Level 3 or less.

Further, as illustrated in FIG. 10, in Examples 9 to 11, the film-forming rate is in a range of about 0.6 (μm/h) to 1.8 (μm/h), resulting in that the sufficient film-forming rate is secured. That is, such film-forming as the film-forming rate falls within the above-described preferable range was performed.

Further, as illustrated in FIG. 11, in Examples 9 to 11, the substrate (work) temperature was in a range of about 198° C. to 222° C., resulting in that the film-forming was performed so that the substrate (work) temperature fell within the above-described preferable range.

In the meantime, in Comparative example 5, the bias voltage of the power supply was set to 0.6 kV to perform the film-forming. As a result, under the film-forming condition of Comparative example 5, as illustrated in Table 3, a decrease in the surface hardness and a decrease in the adhesiveness of the DLC film were seen.

As explained above, it was found that under the film-forming conditions of Examples 9 to 11 illustrated in Table 3 and FIG. 9 to FIG. 11, the acetylene gas and the Ar gas are used as the film-forming gas and the DLC film excellent in surface hardness and adhesiveness can be obtained. Further, it was found that the substrate temperature and the film-forming rate on this occasion are each also fall within a preferable numerical value range. Furthermore, comparison between Table 2 and Table 3 revealed that a predetermined flow rate of Ar gas is added when the acetylene gas is used as the film-forming gas, to thereby achieve an improvement in the surface hardness of the DLC film.

(Change of Discharge Current (Peak Current))

Next, as Examples 12 and 13, only the acetylene gas was used as the film-forming gas, the gas pressure was set to 1 Pa, the discharge current (peak current) of the power supply was set to 8 A and 12 A, and film-forming of DLC films was performed. Film-forming conditions of Examples 12 and 13 are as illustrated in Table 4 below. Incidentally, in Table 4, film characteristics of the DLC films film-formed under the individual film-forming conditions are also described.

TABLE 4

|  |  |  |  | EXAMPLE 12 | EXAMPLE 13 |
|---|---|---|---|---|---|
| DLC FILM-FORMING CONDITION | GAS |  |  | C2H2 | C2H2 |
|  | PRESSURE |  | Pa | 1 | 1 |
|  | GAS FLOW RATE |  | sccm | 1000 | 1000 |
| PLASMA CVD | POWER SUPPLY | MODE |  | PULSE | PULSE |
|  |  | FREQUENCY | Hz | 1K | 1K |
|  |  | Duty RATIO | % | 30 | 30 |
|  |  | BIAS VOLTAGE | kV | 1.2 | 1.5 |
|  |  | DISCHARGE CURRENT | A | 8 | 12 |
|  | DLC FILM-FORMING TIME |  | min | 75 | 75 |
|  | DLC FILM-FORMING RATE |  | μm/h | 1.7 | 2.19 |
|  | SUBSTRATE TEMPERATURE |  | ° C. | 203 | 235 |
| FILM CHARACTERISTICS | FILM THICKNESS | TOTAL THICKNESS | μm | 2.72 | 3.37 |
|  |  | DLC | μm | 2.12 | 2.74 |
|  |  | TiC | μm | 0.6 | 0.63 |
|  | SURFACE HARDNESS | HIT | GPa | 16.4 | 17.4 |
|  | ADHESIVENESS | ROCKWELL INDENTATION |  | LEVEL 1 | LEVEL 1 |

As illustrated in Table 4, under the film-forming conditions illustrated in Examples 12 and 13, it was possible to film-form such a DLC film as the surface hardness (HIT) is 16 GPa or more and the adhesiveness is Level 1. Further, the film-forming rate is in a range of about 1.7 μm/h to 22 μm/h, resulting in that the sufficient film-forming rate is secured. Furthermore, the substrate (work) temperature is in a range of 203° C. to 235° C., to thus fall within a preferable range. The result of Table 4 reveled that increasing a peak current value makes it possible to achieve improvements in the adhesiveness and the surface hardness of the DLC film to be film-formed.

(Change of Pulse Frequency)

Figure 12:
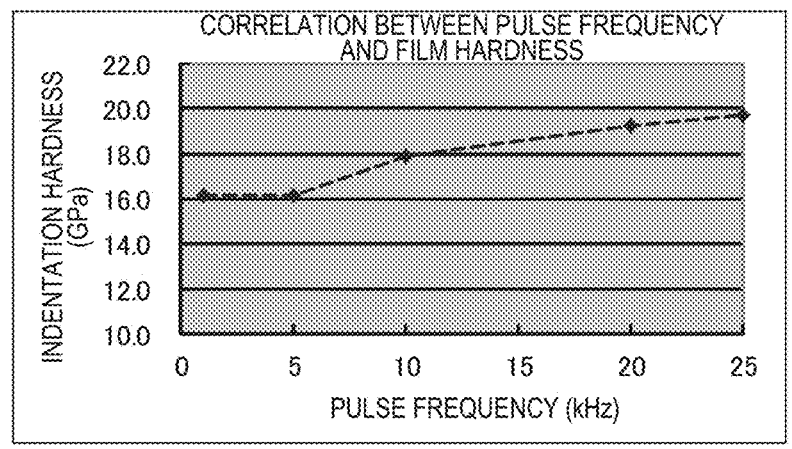
FIG. 12 is a graph illustrating the correlation between a pulse frequency and the HIT (indentation hardness) of Examples 14 to 18.

Next, as Examples 14 to 18, only the acetylene gas was used as the film-forming gas, each frequency of the DC pulse power supply was set to 1 kHz, 5 kHz, 10 kHz, 20 kHz, and 25 kHz, and film-forming of DLC films was performed. Film-forming conditions of Examples 14 to 18 are as illustrated in Table 5 below. Here, when the frequency of the pulse power supply becomes greater than 100 kHz, for example, plasma is not generated stably to cause a risk that the film-forming becomes unstable, and further there are growing concerns about an increase in size of the apparatus, an increase in the work temperature, and the like, and therefore it is preferably set to not less than 1 kHz and not more than 100 kHz. Furthermore, as illustrated in Table 5 below, it is more preferably set to not less than 1 kHz and not more than 25 kHz. Incidentally, in Table 5, film characteristics of the DLC films film-formed under the individual film-forming conditions are also described. Further, FIG. 12 is a graph illustrating the correlation between the pulse frequency and the HIT (indentation hardness) of Examples 14 to 18.

As illustrated in Table 6, in Examples 19 to 21, even when the pressure (film-forming pressure) was one of 0.5 Pa, 1 Pa, and 3 Pa, it was possible to film-form such a DLC film as the surface hardness (HIT) is 10 GPa or more and the adhe-

TABLE 5

| | | | | EXAMPLE 14 | EXAMPLE 15 | EXAMPLE 16 | EXAMPLE 17 | EXAMPLE 18 |
|---|---|---|---|---|---|---|---|---|
| DLC FILM-FORMING CONDITION PLASMA CVD | GAS | | | $C_2H_2$ | $C_2H_2$ | $C_2H_2$ | $C_2H_2$ | $C_2H_2$ |
| | PRESSURE | | Pa | 1 | 1 | 1 | 1 | 1 |
| | GAS FLOW RATE | | sccm | 1000 | 1000 | 1000 | 1000 | 1000 |
| | POWER SUPPLY | MODE | | PULSE | PULSE | PULSE | PULSE | PULSE |
| | | FREQUENCY | kHz | 1 | 5 | 10 | 20 | 25 |
| | | Duty RATIO | % | 30 | 30 | 30 | 30 | 30 |
| | | BIAS VOLTAGE | kV | 1.05 | 1.05 | 1.05 | 1.05 | 1.05 |
| | | DISCHARGE CURRENT | A | 4 | 4 | 4 | 4 | 4 |
| | DLC FILM-FORMING TIME | | min | 100 | 100 | 100 | 100 | 100 |
| | DLC FILM-FORMING RATE | | μm/h | 1.36 | 1.19 | 1.36 | 1.21 | 1.36 |
| | WORK TEMPERATURE | | °C. | 175 | 175 | 175 | 175 | 175 |
| FILM CHARACTERISTICS | FILM THICKNESS | TOTAL THICKNESS | μm | 2.86 | 2.58 | 2.87 | 2.62 | 2.86 |
| | | DLC | μm | 2.26 | 1.98 | 2.27 | 2.02 | 2.26 |
| | | TiC | μm | 0.6 | 0.6 | 0.6 | 0.6 | 0.6 |
| | SURFACE HARDNESS | HIT | GPa | 16.1 | 16.1 | 17.9 | 19.2 | 19.7 |
| | ADHESIVENESS | ROCKWELL INDENTATION | | LEVEL 1 | LEVEL 1 | LEVEL 2 | LEVEL 1 | LEVEL 2 |

As illustrated in Table 5, the pulse frequency of the power supply was set to 1 kHz, 5 kHz, 10 kHz, 20 kHz, and 25 kHz in Examples 14 to 18. As illustrated in Table 5 and FIG. 12, it was found that with an increase in the pulse frequency of the power supply, the surface hardness (HIT) increases, and particularly, the pulse frequency is set to 10 kHz or more, and thereby the surface hardness (HIT) becomes 17.9 GPa or more, resulting in that a DLC film more excellent in hardness is film-formed. Further, in Examples 14 to 18, such film-forming as the film-forming rate and the adhesiveness each also fall within a preferable range was performed.

(Change of Film-Forming Pressure)

Figure 13:
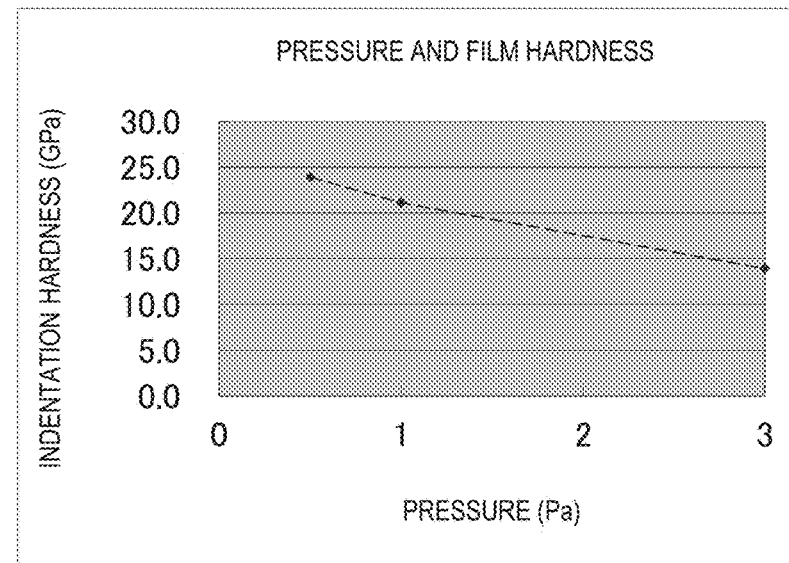
FIG. 13 is a graph illustrating the correlation between a pressure (film-forming pressure) and the HIT (indentation hardness) of Examples 19 to 21.

Next, as Examples 19 to 21, only the acetylene gas was used as the film-forming gas, the gas pressure was set to 0.5 Pa, 1 Pa, and 3 Pa, the pulse frequency of the power supply was set to 25 kHz in all the cases, and film-forming of DLC films was performed. Film-forming conditions of Examples 19 to 21 are as illustrated in Table 6 below. Incidentally, in Table 6, film characteristics of the DLC films film-formed under the individual film-forming conditions are also described. Further, FIG. 13 is a graph illustrating the correlation between the pressure (film-forming pressure) and the HIT (indentation hardness) of Examples 19 to 21.

siveness is Level 1. That is, it was found that even when one of the film-forming conditions of Examples 19 to 21 is applied, the DLC film excellent in surface hardness and adhesiveness can be Obtained. Further, it was found that the substrate temperature and the film-forming rate on this occasion each also fall within a preferable numerical value range.

INDUSTRIAL APPLICABILITY

The present invention is applicable to a film-forming method of a DLC (Diamond Like Carbon) film.

What is claimed is:

1. A DLC film film-forming method being the film-forming method to film form the DLC film on a substrate by a plasma CVD method that applies a voltage to the substrate to plasmatize a gas in a chamber, the method comprising:
setting the voltage to be applied to the substrate using a DC pulse power supply to a bias voltage;
using an acetylene gas or a methane gas as a film-forming gas to be supplied into the chamber;

TABLE 6

| | | | | EXAMPLE 19 | EXAMPLE 20 | EXAMPLE 21 |
|---|---|---|---|---|---|---|
| DLC FILM-FORMING CONDITION PLASMA CVD | GAS | | | $C_2H_2$ | $C_2H_2$ | $C_2H_2$ |
| | PRESSURE | | Pa | 0.5 | 1 | 3 |
| | GAS FLOW RATE | | sccm | 1000 | 1000 | 1000 |
| | POWER SUPPLY | MODE | | PULSE | PULSE | PULSE |
| | | FREQUENCY | kHz | 25 | 25 | 25 |
| | | Duty RATIO | % | 30 | 30 | 30 |
| | | BIAS VOLTAGE | kV | 1.35 | 1.05 | 0.8 |
| | | DISCHARGE CURRENT | A | 4 | 4 | 4 |
| | DLC FILM-FORMING TIME | | min | 140 | 75 | 45 |
| | DLC FILM-FORMING RATE | | μm/h | 0.6 | 1.2 | 2 |
| | WORK TEMPERATURE | | °C. | 200 | 200 | 200 |
| FILM CHARACTERISTICS | FILM THICKNESS | TOTAL THICKNESS | μm | 2.00 | 2.10 | 2.10 |
| | | DLC | μm | 1.40 | 1.50 | 1.50 |
| | | TiC | μm | 0.6 | 0.6 | 0.6 |
| | SURFACE HARDNESS | HIT | GPa | 23.9 | 21.1 | 13.9 |
| | ADHESIVENESS | ROCKWELL INDENTATION | | LEVEL 1 | LEVEL 1 | LEVEL 1 | setting the total pressure of the gas in the chamber to not less than 0.5 Pa and not more than 3 Pa when the methane gas is used;

setting the total pressure of the gas in the chamber to not less than 0.3 Pa and not more than 3 Pa when the acetylene gas is used; and setting the bias voltage to not less than 0.9 kV and not more than 2.2 kV.

2. The DLC film film-forming method according to claim 1, further comprising:

mixing an Ar gas with the acetylene gas or the methane gas as the film-forming gas.

3. The DLC film film-forming method according to claim 1, further comprising:

setting a frequency of the pulse power supply to not less than 1 kHz and not more than 100 kHz.

4. The DLC film film-forming method according to claim 1, further comprising:

forming an intermediate layer on the substrate in the chamber by a PVD method; and next film-forming the DLC film in the same chamber by the plasma CVD method.

5. The DLC film film-forming method according to claim 4, wherein in the forming of the intermediate layer, an Ar gas and a methane gas are used as the film-forming gas, and while changing a sputtering output and a ratio between the Ar gas and the methane gas in the film-forming gas, a composition is continuously changed in the intermediate layer.

6. The DLC film film-forming method according to claim 5, wherein in the forming of the intermediate layer, the ratio between the Ar gas and the methane gas is constituted so that the composition of the intermediate layer becomes rich in metal on the substrate side and becomes rich in carbon on the DLC film side.

* * * * *